(12) United States Patent
Hsu

(10) Patent No.: US 6,495,377 B2
(45) Date of Patent: Dec. 17, 2002

(54) METHOD OF FABRICATING FERROELECTRIC MEMORY TRANSISTORS

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 108 days.

(21) Appl. No.: 09/783,817

(22) Filed: Feb. 13, 2001

(65) Prior Publication Data

US 2002/0108927 A1 Aug. 15, 2002

(51) Int. Cl.⁷ .................. H01L 21/8242; H01G 7/06
(52) U.S. Cl. ........................................ 438/3; 438/240
(58) Field of Search .......................... 438/3, 238–240, 438/250–256, 381, 393–396

(56) References Cited

U.S. PATENT DOCUMENTS 5,350,705 A * 9/1994 Brassington et al. ....... 257/295
5,401,680 A * 3/1995 Abt et al. ................... 438/240

* cited by examiner

Primary Examiner—Jey Tsai
(74) Attorney, Agent, or Firm—David C. Ripma; Matthew D. Rabdau; Scott C. Krieger

(57) ABSTRACT

A method of fabricating a ferroelectric memory transistor includes preparing a substrate, including isolating an active region; forming a gate region; depositing an electrode plug in the gate region; depositing an oxide side wall about the electrode plug; implanting ions to form a source region and a drain region; annealing the structure to diffuse the implanted ions; depositing an intermediate oxide layer over the structure; removing the electrode plug; depositing a bottom electrode in place of the electrode plug; depositing a ferroelectric layer over the bottom electrode; depositing a top electrode over the ferroelectric layer; depositing a protective layer; depositing a passivation oxide layer over the structure; and metallizing the structure.

11 Claims, 5 Drawing Sheets

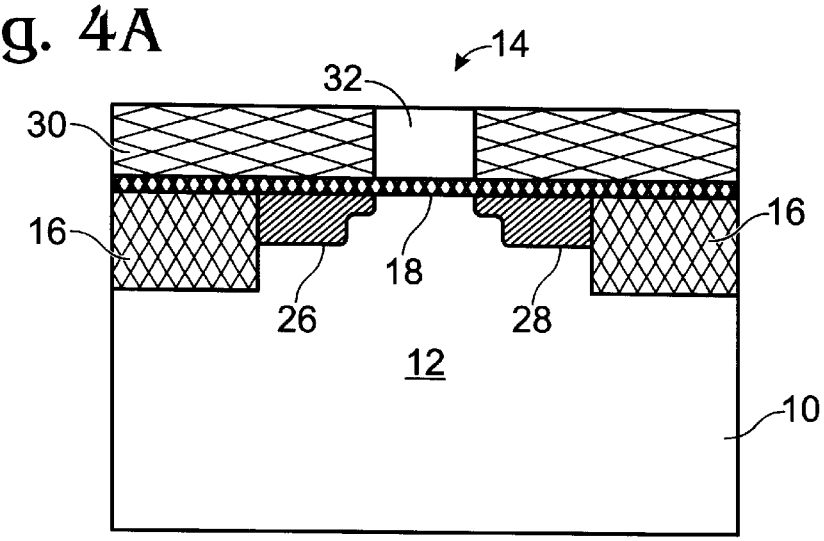
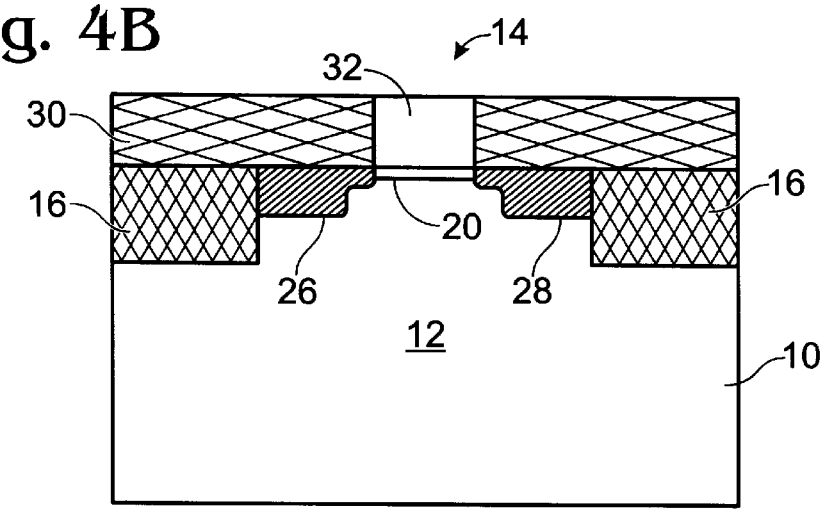
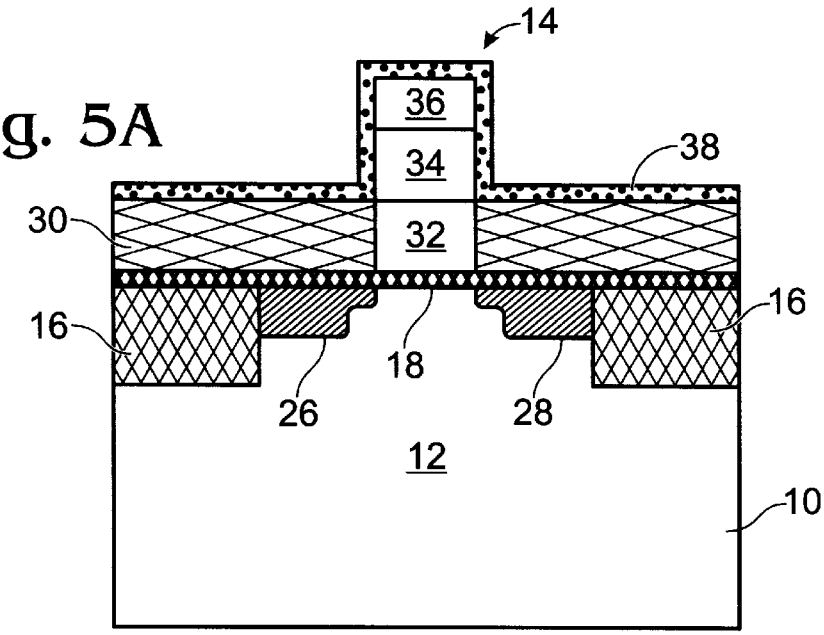

METHOD OF FABRICATING FERROELECTRIC MEMORY TRANSISTORS

FIELD OF THE INVENTION

This invention relates to the manufacture of transistors incorporating ferroelectric thin films therein, and specifically to fabrication of a metal/ferro metal oxide semiconductor (MFMOS) and metal/ferro metal semiconductor (MFMS) transistors using a nitride replacement technique.

BACKGROUND OF THE INVENTION

Ferroelectric thin films are used in nonvolatile memories. Metal-ferroelectric-metal-silicon semi-conductors, also referred to herein as ferroelectric memory (FEM) cells are particularly useful as memory transistors. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a nondestructive readout (NDR). The latter feature enables a MFS FET device to be read thousands of times without switching the ferroelectric polarization. Various forms of MFS FET structures may be constructed, such as metal ferroelectric insulators in silicon (MFIS) FET, metal ferroelectric metal semiconductor (MFMS) FET, and metal ferroelectric metal oxide semiconductor (MFMOS) FET.

It is critically important that, during etching of the gate stack of MFMOS and MFMS memory transistors, the etching does not extend significantly into the silicon. The thickness of the gate oxide of a MFMOS memory transistor is very thin, and it is exceptionally difficult to stop the gate stack etching process at the level of the gate oxide. Large source/drain series resistances may occurs if excessive amounts of silicon are consumed by the gate stack etching process. In the case of MFMS memory transistors, the surface channel is very shallow. This channel may be completely removed by etching during the gate stack etching process if proper controls are not maintained.

SUMMARY OF THE INVENTION

A method of fabricating a ferroelectric memory transistor includes preparing a substrate, including isolating an active region; forming a gate region; depositing an electrode plug in the gate region, depositing an oxide side wall about the electrode plug; implanting Arsenic ions to form a source region and a drain region; annealing the structure to diffuse the implanted ions; depositing an intermediate oxide layer over the structure; removing the electrode plug; depositing a bottom electrode in place of the electrode plug; depositing a ferroelectric layer over the bottom electrode; depositing a top electrode over the ferroelectric layer; depositing a protective layer; depositing a passivation oxide layer over the structure, and metallizing the structure.

It is an object of the invention to provide a method of fabricating MFMOS memory transistors and MFMS memory transistors which does not require exceptionally precise etching procedures.

Another object of the invention to provide a method of fabricating MFMOS memory transistors and MFMS memory transistors which will reduce fabrication cost and increase production output.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 1A to 5A depict steps in the fabrication of a MFMOS memory transistor according to the method of the invention.

FIGS. 1B to 5B depict steps in the fabrication of a MFMS memory transistor according to an alternate embodiment of the invention.

DETAILED DESCRIPTION OF THE PREFERRED EMBODIMENTS

Figure 1A:
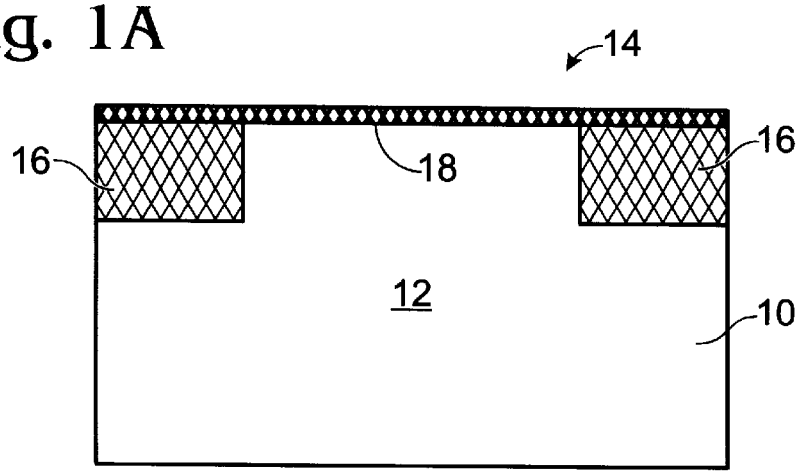
Figure 1B:
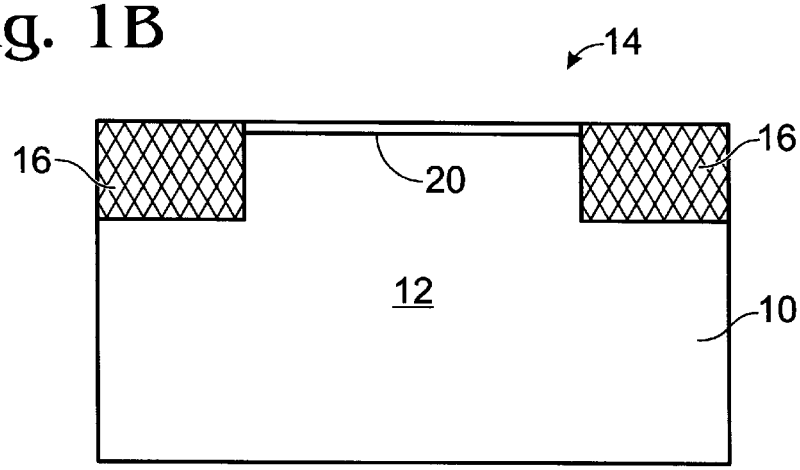

As previously noted, the etching processes used to etch the gate stack of metal/ferro metal oxide semiconductor (MFMOS) and metal/ferro metal semiconductor (MFMS) memory transistors frequently consume too much silicon during the etching process, particularly in the case of MFMOS memory transistor, wherein the gate oxide is very thin. It is very difficult to stop the gate stack etching process at the level of the gate oxide. Large source/drain series resistances, on the order of 1,000 ohms, may occur when excessive consumption of silicon occurs during the gate stack etching process. In the case of MFMS memory transistors, the surface channel is very shallow, and may be completely removed during the gate stack etching process. The method of the invention provides a method for fabricating MFMOS memory transistors and MFMS memory transistors without the requirement for exceptionally precise gate stack etching techniques.

The method of the invention includes forming the bottom electrode of the gate stack by a nitride replacement process, which allows the bottom electrode of the gate stack to remain flat. During the course of nitride etching, there is virtually no silicon loss in the adjacent gate-to-source and gate-to-drain regions. Therefore, an ultra thin gate oxide may be provided for MFMOS memory transistors, and an ultra shallow surface conducting channel may be incorporated into MFMS memory transistors. The steps in the fabrication of the structure for a MFMOS memory transistor and for a MFMS memory transistors are depicted in FIGS. 1A–6A and FIGS. 1B–6B, respectively. The steps used to fabricate both types of devices are sufficiently similar that they will be described simultaneously.

The process sequence is as follows, and now referring to FIG. 1, state-of-the-art processes are followed for preparing a p-type substrate 10, for well formation 12 by implantation of Boron ions, at a dose of about $1 \cdot 10^{12}$ cm$^{-2}$ to $1 \cdot 10^{13}$ cm$^{-2}$, and at an energy level of 30 keV to 50 keV, threshold voltage adjustment of an active region 14, active device isolation by oxide 16, and gate oxidation 18 for MFMOS memory transistor or surface channel formation 20 for MFMS memory transistor.

Figure 2A:
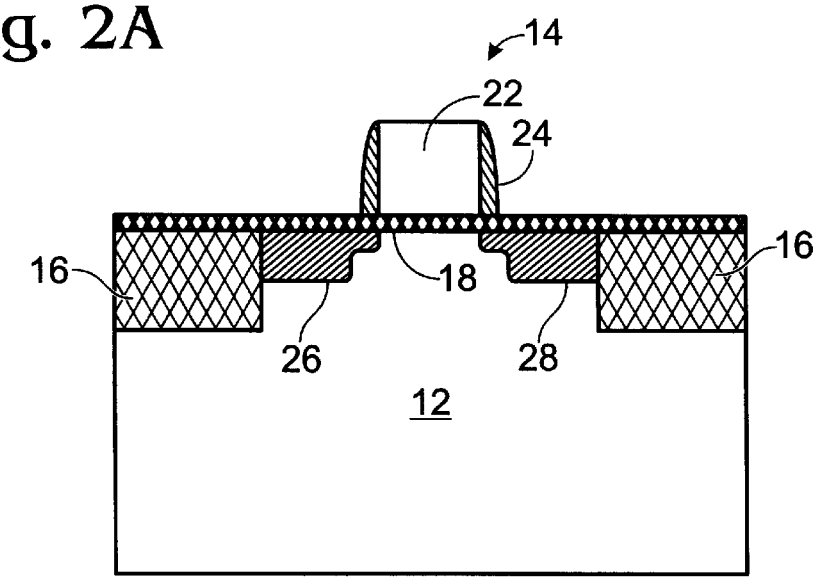
Figure 2B:
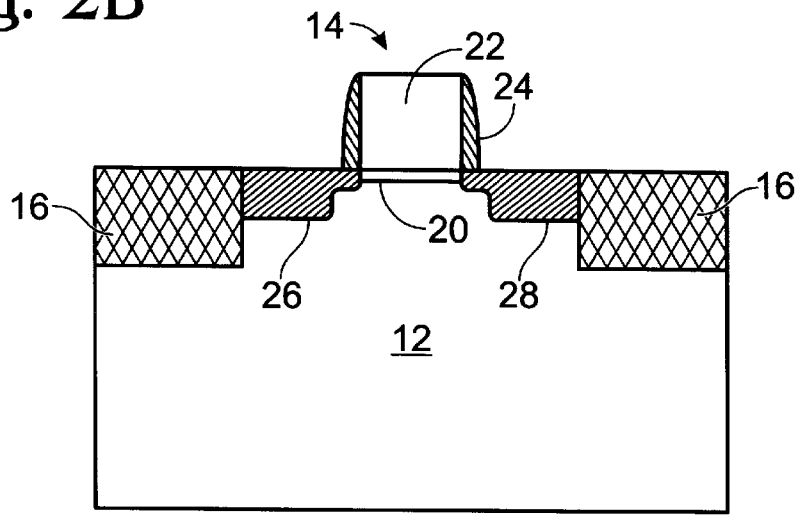

Referring now to FIG. 2, a layer of silicon nitride 22, which ultimately forms an electrode plug, is deposited to a thickness of about between 200 nm to 300 nm. Photoresist is applied, and the silicon nitride is plasma etched, stopping at the level of substrate 10 silicon. The photoresist is then removed. It should be noted that the gate mask width must be larger than the required gate width, by approximately two times the thickness of the silicon nitride to be removed by the wet etch process.

The next step is low doping density (LDD) ion implantation into a source/drain region, although the MFMS memory transistor may not requires this LDD ion implantation. LDD implantation includes implantation of Arsenic ions, at an energy level of 10 keV to 30 keV and a dose of $5 \cdot 10^{12}$ cm$^{-2}$ to $5 \cdot 10^{13}$ cm$^{-2}$.

An oxide layer is deposited by CVD, to a thickness of about between 20 nm to 150 nm for the MFMOS memory transistor and to a thickness of about between 100 nm to 200 nm for the MFMS memory transistor. The structure is masked and etched, leaving a wall oxide 24 about electrode plug 22. A source region 26 and a drain region 28 are formed by implantation of Arsenic ions, at a dose of about $1 \cdot 10^{15}$ cm$^{-2}$ to $5 \cdot 10^{15}$ cm$^{-2}$ and at an energy level of 30 keV to 70 keV. The structure is annealed, to provide ion diffusion, at a temperature of between about 700° C. to 950° C. for about 30 minutes to activate the N+ implanted ions in source region 26 and drain region 28.

Figure 3A:
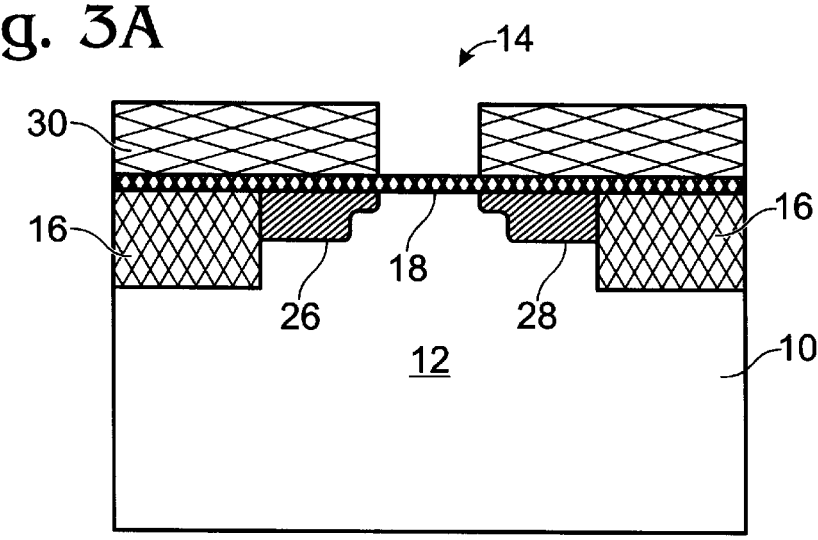
Figure 3B:
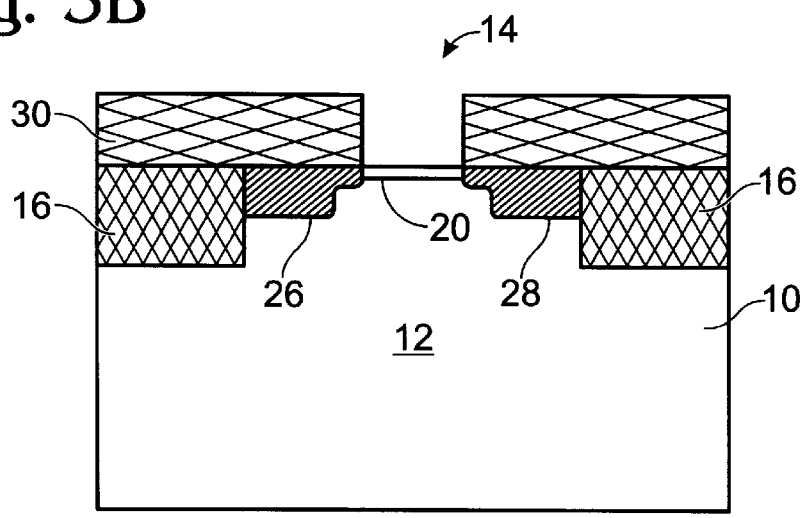

Referring to FIG. 3, an intermediate oxide layer 30 is deposited by CVD, to a thickness which is at least 150% thicker than the thickness of electrode plug 22. Intermediate oxide layer 30 and silicon nitride 22 are smoothed and thinned by chemical mechanical polishing (CMP). The silicon nitride is then wet etched completely to remove the electrode plug, resulting in the structure shown in FIG. 3.

A bottom electrode 32 of Indium is deposited, and smoothed by CMP, as shown in FIG. 4.

Figure 5B:
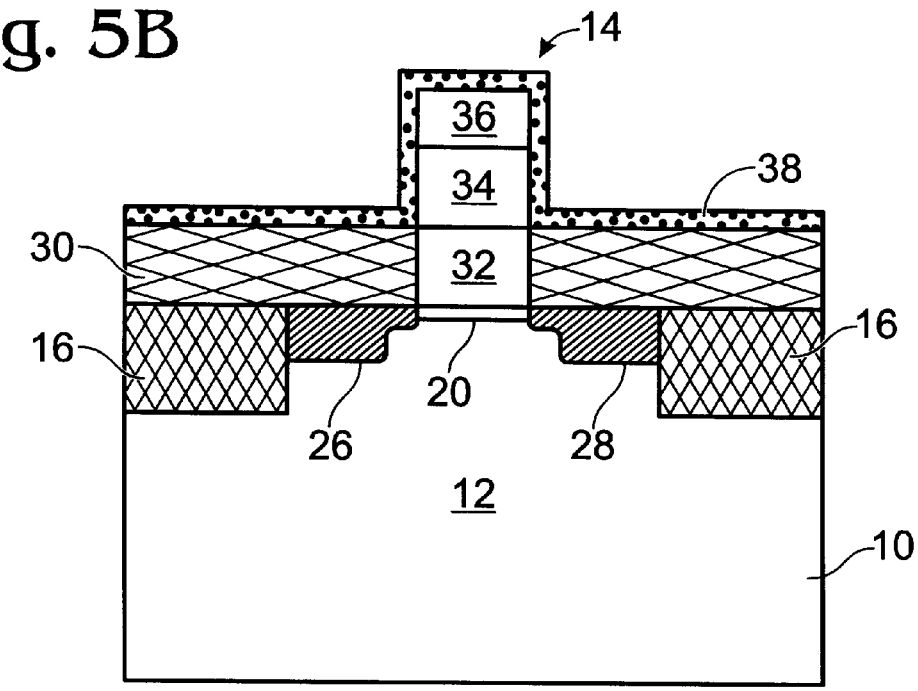

Turning now to FIG. 5, a ferroelectric thin film 34 and a top electrode 36 are deposited. Photoresist is applied over the gate stack, and the top electrode and ferroelectric are etched. The photoresist is then removed. A protection film 38, such as TiO$_2$, or silicon nitride, is deposited to a thickness of between about 10 nm to 30 nm.

Figure 6A:
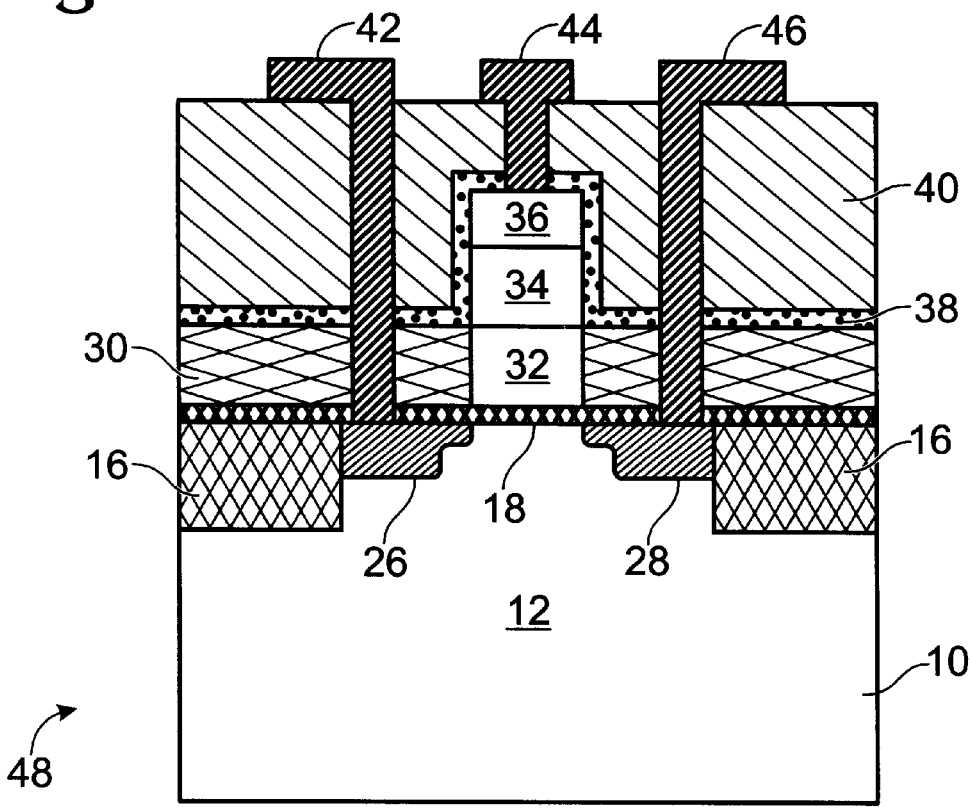
FIG. 6A depicts the completed MFMOS memory of FIGS. 1A to 5A.
Figure 6B:
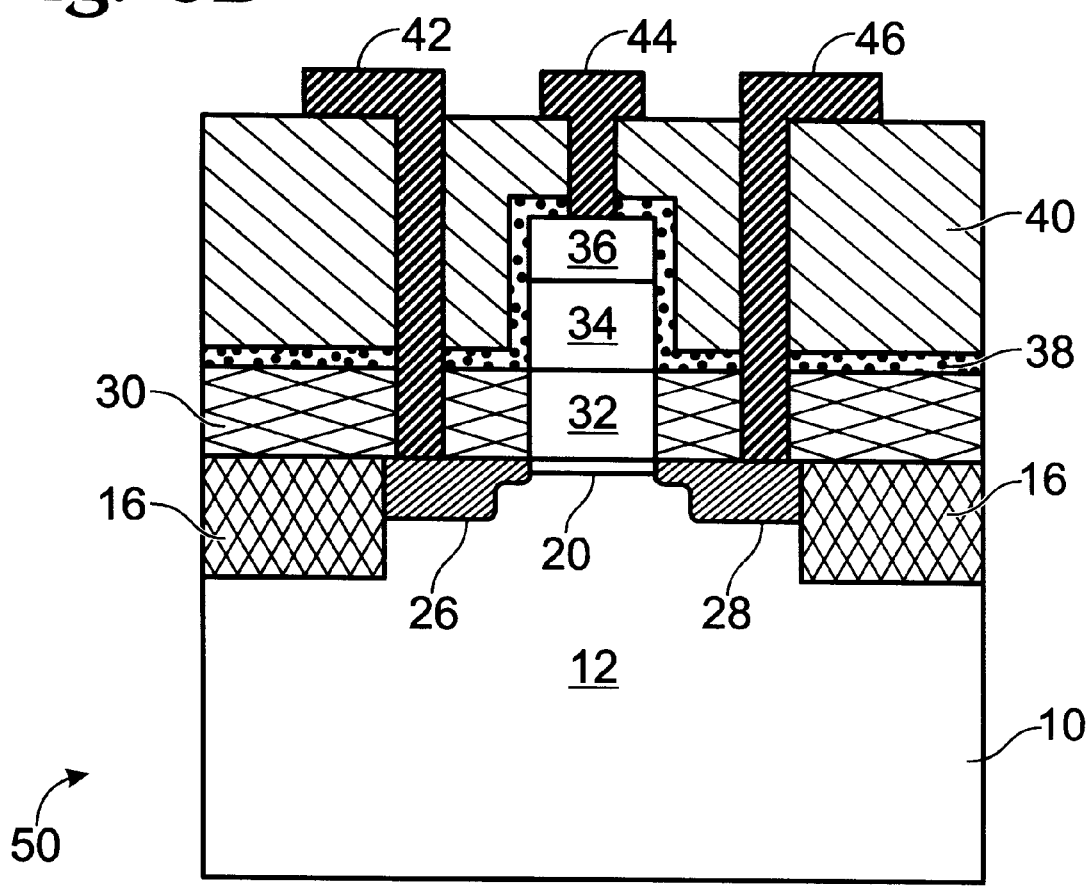
FIG. 6B depicts the completed MFMS memory transistor of FIGS. 1B to 5B.

The remaining process steps include CVD of a passivation oxide layer 40, and metallization to form a source electrode 42, a gate electrode 44 and a drain electrode 46, which steps may be performed using state-of-the-art processes, resulting in a final MFMOS memory transistor device 48, as shown in FIG. 6A, and a final MFMS memory transistor device, as shown in FIG. 6B.

Thus, a method for fabricating ferroelectric memory transistors has been disclosed. It will be appreciated that further variations and modifications thereof may be made within the scope of the invention as defined in the appended claims.

I claim:

1. A method of fabricating a ferroelectric memory transistor comprising:

preparing a substrate, including isolating an active region, forming a gate region;

depositing an electrode plug in the gate region;

depositing an oxide side wall about the electrode plug;

implanting Arsenic ions to form a source region and a drain region;

annealing the structure to diffuse the implanted ions;

depositing an intermediate oxide layer over the structure;

removing the electrode plug;

depositing a bottom electrode in place of the electrode plug;

depositing a ferroelectric layer over the bottom electrode;

depositing a top electrode over the ferroelectric layer;

depositing a protective layer;

depositing a passivation oxide layer over the structure; and metallizing the structure.

2. The method of claim 1 wherein said forming a gate region includes oxidizing silicon of the substrate.

3. The method of claim 1 wherein said forming a gate region includes forming a surface channel.

4. The method of claim 1 which further includes LDD implantation of Arsenic ions, at an energy level of 10 keV to 30 keV and a dose of $5 \cdot 10^{12}$ cm$^{-2}$ to $5 \cdot 10^{13}$ cm$^{-2}$.

5. The method of claim 1 wherein said implanting includes implanting Arsenic ions, at a dose of about $1 \cdot 10^{15}$ cm$^{-2}$ to $5 \cdot 10^{15}$ cm$^{-2}$, and at an energy level of 30 keV to 70 keV and wherein said annealing includes annealing the structure at a temperature of between about 700° C. to 950° C. for about 30 minutes.

6. The method of claim 1 wherein said depositing a protective layer includes depositing a layer of material taken from the group of materials consisting of TiO$_2$ and silicon nitride to a thickness of between about 10 nm to 30 nm.

7. A method of fabricating a ferroelectric memory transistor comprising:

preparing a substrate, including isolating an active region;

forming a gate region;

depositing an electrode plug of silicon nitride to a thickness of between about 200 nm to 300 nm in the gate region;

depositing an oxide layer about the electrode plug and etching the oxide layer to form a sidewall oxide about the electrode plug;

implanting Arsenic ions, at a dose of about $1 \cdot 10^{15}$ cm$^{-2}$ to $5 \cdot 10^{15}$ cm$^{-2}$, and at an energy level of 30 keV to 70 keV to form a source region and a drain region, and annealing the structure at a temperature of between about 700° C. to 950° C. for about 30 minutes to diffuse the implanted ions;

depositing an intermediate oxide layer over the structure, wherein said depositing includes depositing the intermediate layer to a thickness of at least 150% greater than that of the electrode plug;

smoothing the structure by CMP;

etching the electrode plug completely to remove the electrode plug;

depositing a bottom electrode in place of the electrode plug;

depositing a ferroelectric layer over the bottom electrode;

depositing a top electrode over the ferroelectric layer;

depositing a protective layer;

depositing a passivation oxide layer over the structure; and metallizing the structure.

8. The method of claim 7 wherein said forming a gate region includes oxidizing silicon of the substrate.

9. The method of claim 7 wherein said forming a gate region includes forming a surface channel.

10. The method of claim 7 which further includes LDD implantation of Arsenic ions, at an energy level of 10 keV to 30 keV and a dose of $5 \cdot 10^{12}$ cm$^{-2}$ to $5 \cdot 10^{13}$ cm$^{-2}$.

11. The method of claim 7 wherein said depositing a protective layer includes depositing a layer of material taken from the group of materials consisting of $TiO_2$ and silicon nitride to a thickness of between about 10 nm to 30 nm.

* * * * *